(12) United States Patent
Kaburlasos et al.

(10) Patent No.: US 7,757,039 B2
(45) Date of Patent: Jul. 13, 2010

(54) DRAM SELECTIVE SELF REFRESH

(76) Inventors: Nikos Kaburlasos, 3300 Capital Center Dr. #149, Rancho Cordova, CA (US) 95670; Jim Kardach, 20271 La Paloma Ave., Saratoga, CA (US) 95070

( * ) Notice: Subject to any disclaimer, the term of this patent is extended or adjusted under 35 U.S.C. 154(b) by 475 days.

(21) Appl. No.: 11/901,502

(22) Filed: Sep. 18, 2007

(65) Prior Publication Data
US 2009/0077307 A1    Mar. 19, 2009

(51) Int. Cl.
*G06F 12/02* (2006.01)
*G06F 1/32* (2006.01)
(52) U.S. Cl. .................. 711/106; 711/156; 711/202; 713/324
(58) Field of Classification Search .......... None
See application file for complete search history.

(56) References Cited

U.S. PATENT DOCUMENTS

| | | | |
|---|---|---|---|
| 7,210,009 B2* | 4/2007 | Gulick et al. | 711/159 |
| 2002/0073358 A1* | 6/2002 | Atkinson | 714/21 |
| 2007/0150760 A1* | 6/2007 | Nowlin | 713/300 |

* cited by examiner

*Primary Examiner*—Than Nguyen
(74) *Attorney, Agent, or Firm*—Caven & Aghevli LLC

(57) ABSTRACT

In some embodiments, an electronic apparatus comprises a communication interface, an input/output interface, a processor, and logic to collect, in the electronic apparatus, a first identifier associated with a first communication device and second identifier associated with a second communication device, logic to establish a communication connection between the electronic apparatus and the first communication device, and logic to initiate, in the electronic apparatus, a connection request for a communication connection between the first communication device and the second communication device. Other embodiments may be described.

14 Claims, 4 Drawing Sheets

```
IDENTIFY PAGES TO BE RETAINED
       IN SLEEP MODE
            210
              ↓
   GENERATE RETAINED PAGE MAP
            215
              ↓
    SAVE RETAINED PAGE MAP IN
            MEMORY
            220
              ↓
   GENERATE POINTER TO RETAINED
           PAGE MAP
            225
```

DRAM SELECTIVE SELF REFRESH

BACKGROUND

Advanced Control and Power Interface (ACPI) is a specification that makes hardware status information available to an operating system in computers, including laptops, desktop, servers, etc. More information about ACPI may be found in the Advanced Configuration and Power Interface Specification, Revision 2.0a, Mar. 31, 2002, cooperatively defined by Compaq Computer Corporation, Intel Corporation, Microsoft Corporation, Phoenix Technologies Ltd., and Toshiba Corporation. The ACPI specification was developed to establish industry common interfaces enabling robust operating system (OS)-directed motherboard device configuration and power management of both devices and entire systems. ACPI is the key element in operating system-directed configuration and power management (OSPM).

ACPI is used in personal computers (PCs) running a variety of operating systems, such as Windows® available from Microsoft Corporation, Linux, available as open source form a variety of vendors, and HP-UX, available from Hewlett-Packard Company. ACPI also allows hardware resources to be manipulated. For example, ACPI assists in power management by allowing a computer system's peripherals to be powered on and off for improved power management. ACPI also allows the computer system to be turned on and off by external devices. For example, the touch of a mouse or the press of a key may wake up the computer system using ACPI.

Among other things, ACPI implements low-power usage modes referred to as sleep states. One advantage of sleep states is that some system context information remains stored in memory during the sleep state, which reduces the time required to restore the computing system to an operational state. When a platform is in an ACPI sleep state such as an S3 state, platform state information has been saved in the system dynamic random access memory (DRAM) and most platform components are powered down. In this state, DRAM power and the associated voltage regulator (VR) consume 50-70% of platform power. Techniques to reduce power consumption would find utility.

BRIEF DESCRIPTION OF THE DRAWINGS

The detailed description is described with reference to the accompanying figures.

FIGS. 5-6 are schematic illustrations of DRAM, according to some embodiments.

DETAILED DESCRIPTION

Described herein are exemplary systems and methods for implementing a DRAM selective self-refresh operation in an electronic device such as, e.g., a computer system. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
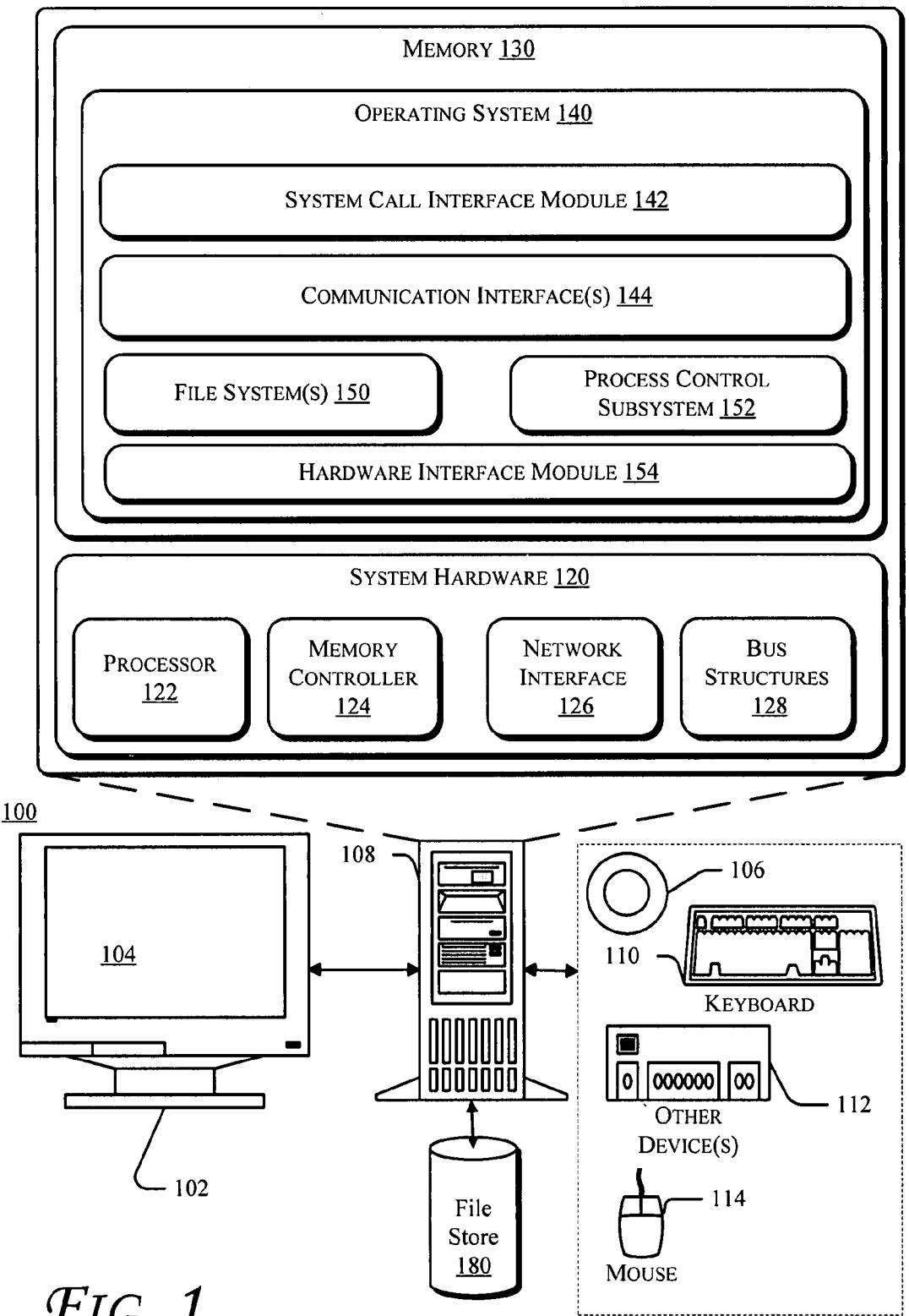
FIG. 1 is a schematic illustration of an electronic device adapted to implement DRAM selective self refresh according to some embodiments.

FIG. 1 is a schematic illustration of an electronic device adapted to implement DRAM selective self refresh according to some embodiments. In some embodiments, system 100 includes a computing device 108 and one or more accompanying input/output devices including a display 102 having a screen 104, one or more speakers 106, a keyboard 110, one or more other I/O device(s) 112, and a mouse 114. The other I/O device(s) 112 may include a touch screen, a voice-activated input device, a track ball, and any other device that allows the system 100 to receive input from a user.

The computing device 108 includes system hardware 120 and memory 130, which may be implemented as random access memory and/or read-only memory. In some embodiments, at least some of the memory is implemented as dynamic random access memory (DRAM). A file store 180 may be communicatively coupled to computing device 108. File store 180 may be internal to computing device 108 such as, e.g., one or more hard drives, CD-ROM drives, DVD-ROM drives, or other types of storage devices. File store 180 may also be external to computer 108 such as, e.g., one or more external hard drives, network attached storage, or a separate storage network.

System hardware 120 may include one or more processors 122, video controllers 124, network interfaces 126, and bus structures 128. The processor(s) 122 may include a general purpose processor, a network processor (that processes data communicated over a computer network, or other types of a processor (including a reduced instruction set computer (RISC) processor or a complex instruction set computer (CISC)). Moreover, the processor(s) 122 may have a single or multiple core design. The processors 122 with a multiple core design may integrate different types of processor cores on the same IC die. Also, the processors 122 with a multiple core design may be implemented as symmetrical or asymmetrical multiprocessors.

Memory controller 124 may function as an adjunction processor that manages memory operations. Memory controller 124 may be integrated onto the motherboard of computing system 100 or may be coupled via an expansion slot on the motherboard.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), or PCI-Express (PCIe), Universal Serial Bus (USB), Advanced Graphics Port (AGP), Personal Computer Memory Card International Association bus (PCMCIA), and Small Computer Systems Interface (SCSI).

Memory 130 may include an operating system 140 for managing operations of computing device 108. In one embodiment, operating system 140 includes a hardware interface module 154 that provides an interface to system hardware 120. In addition, operating system 140 may include a file system 150 that manages files used in the operation of computing device 108 and a process control subsystem 152 that manages processes executing on computing device 108.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

Figure 2:
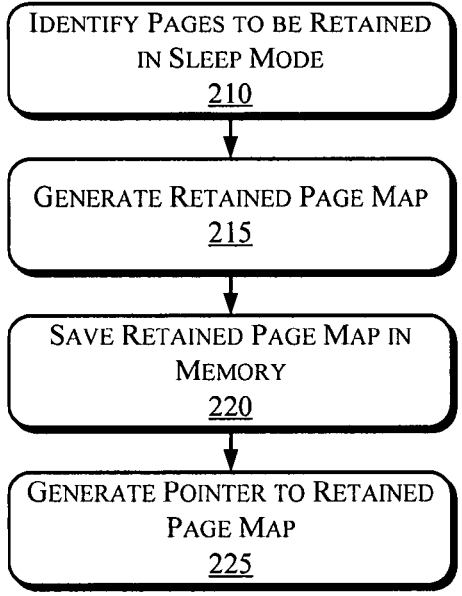
FIG. 2 is a flowchart illustrating operations in a method to implement DRAM selective self refresh, according to some embodiments.
Figure 3:
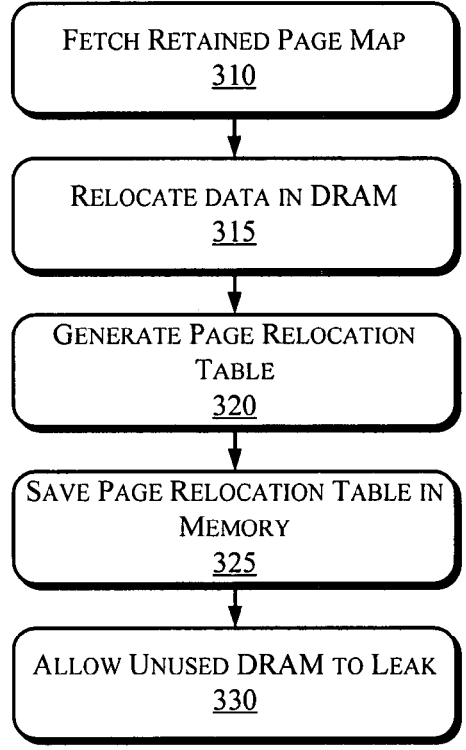
FIG. 3 is a flowchart illustrating operations in a method to implement DRAM selective self refresh, according to some embodiments.
Figure 4:
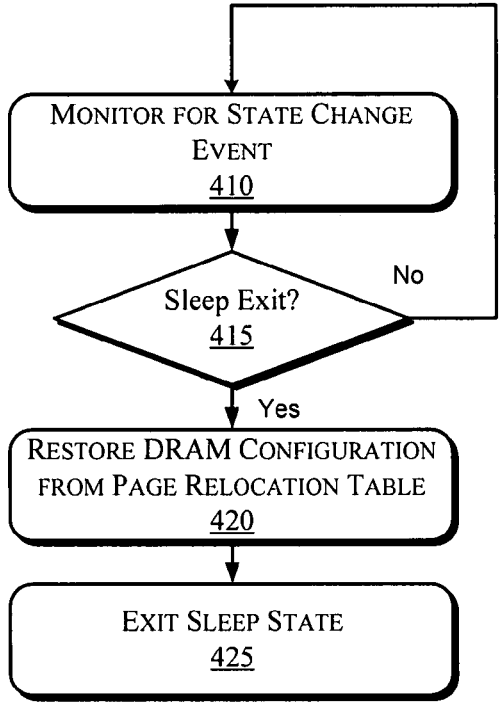
FIG. 4 is a flowchart illustrating operations in a method to implement DRAM selective self refresh, according to some embodiments.

FIGS. 2-4 are flowcharts illustrating operations in a method to implement DRAM selective self refresh, according to some embodiments. In some embodiments, the operations illustrated in FIG. 2 may be implemented by a process executing on an operating system, such as the operating system 140 depicted in FIG. 1. In some embodiments, the method comprises generating a retained page map which indicates memory pages in at least one memory module to be retained in memory, receiving a signal to alter the operating state of the electronic device to a sleep state, relocating contents of memory pages in the retained page map from a first location in a memory device to a second location to consolidate the memory pages identified in the retained page map in a subset of memory devices, generating a page relocation table which indicates the first location and the second location of the contents of the memory pages, and maintaining the subset of memory devices in a self-refresh sleep state. More specific details will be described with reference to FIGS. 2-4.

Referring to FIG. 2, at operation 210 the operating system identifies a number of pages to be retained when the electronic device is placed into an sleep state. For example, in some embodiments the electronic device may be placed into S3 sleep state, although one skilled in the art will recognize that other sleep states are possible. In some embodiments, the operating system 140 maintains page tables which indicate the current status of memory pages, such as whether the page is used or unused, page is used but read-only, page is used, it is read-write but it is not 'dirty' (i.e. it has not been updated since it was loaded in main memory). Thus, in some embodiments, page status information from the operating system can be used to determine which pages need to be retained when the electronic device enters an sleep state. For example, in some embodiments unused pages do not have to be retained in the sleep state read-only pages also do not have to be retained in the sleep state, rather they can optionally be reloaded from the hard-disk when the platform exits the sleep state and returns back to an active state, such as an S0 state, and read-write, non-dirty pages may also not be retained in sleep state, but rather be reloaded from the hard-disk on an exit from sleep. Conceivably, the operating system may choose to not retain read-write dirty pages, as long as it saves them back in to the hard-disk before the platform enters sleep state, so it can later reload them.

In operation 215, the operating system (OS) generates a retained page map. In some embodiments, the retained page map is a bit-map which includes one bit for each page of memory. For example, the OS sets to "1" bit #N in the bit map if it wishes to retain page #N while in sleep state, otherwise it clears that bit. The OS may have the flexibility to choose how many (and which) pages it wishes to retain when the platform transitions into a sleep state. Typically, all unused pages do not have to be retained. In addition, the OS may choose to not retain some or all read-only pages, some or all read-write non-dirty pages or even some read-write dirty pages, as explained above. Once the retained page map has been created, the operating system saves the retained page map in a memory location at operation 220 and passes a pointer to the retained-page map to the memory controller (operation 225). In some embodiments, the retained page map may be stored in a DRAM location that will be retained in a sleep state that implements a refresh mode.

Referring to FIG. 3, the memory controller then fetches the retained-page map from the memory (operation 310) and uses it to determine which pages the OS wants to have retained in a sleep state. In some embodiments, the memory controller possesses information on the manner in which memory pages visible to the operating system are mapped to specific DRAM locations inside a particular DIMM, rank, bank etc., and can determine how to move pages which need to be retained in a sleep state around the DRAM in order to free up as many banks (in different DRAM ranks and SIMMs) as possible, before the platform enters a sleep state.

Figure 5:
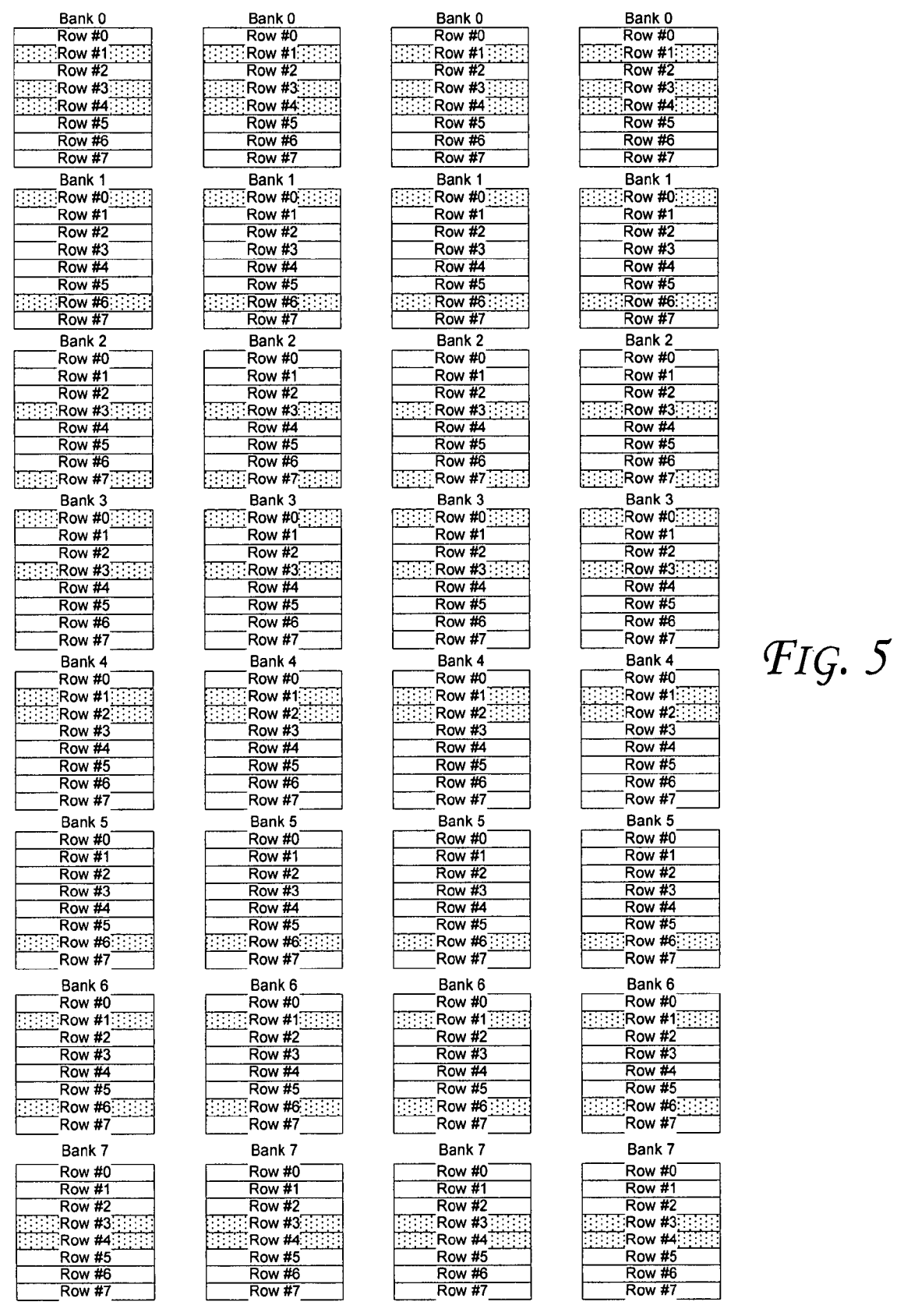
Figure 6:
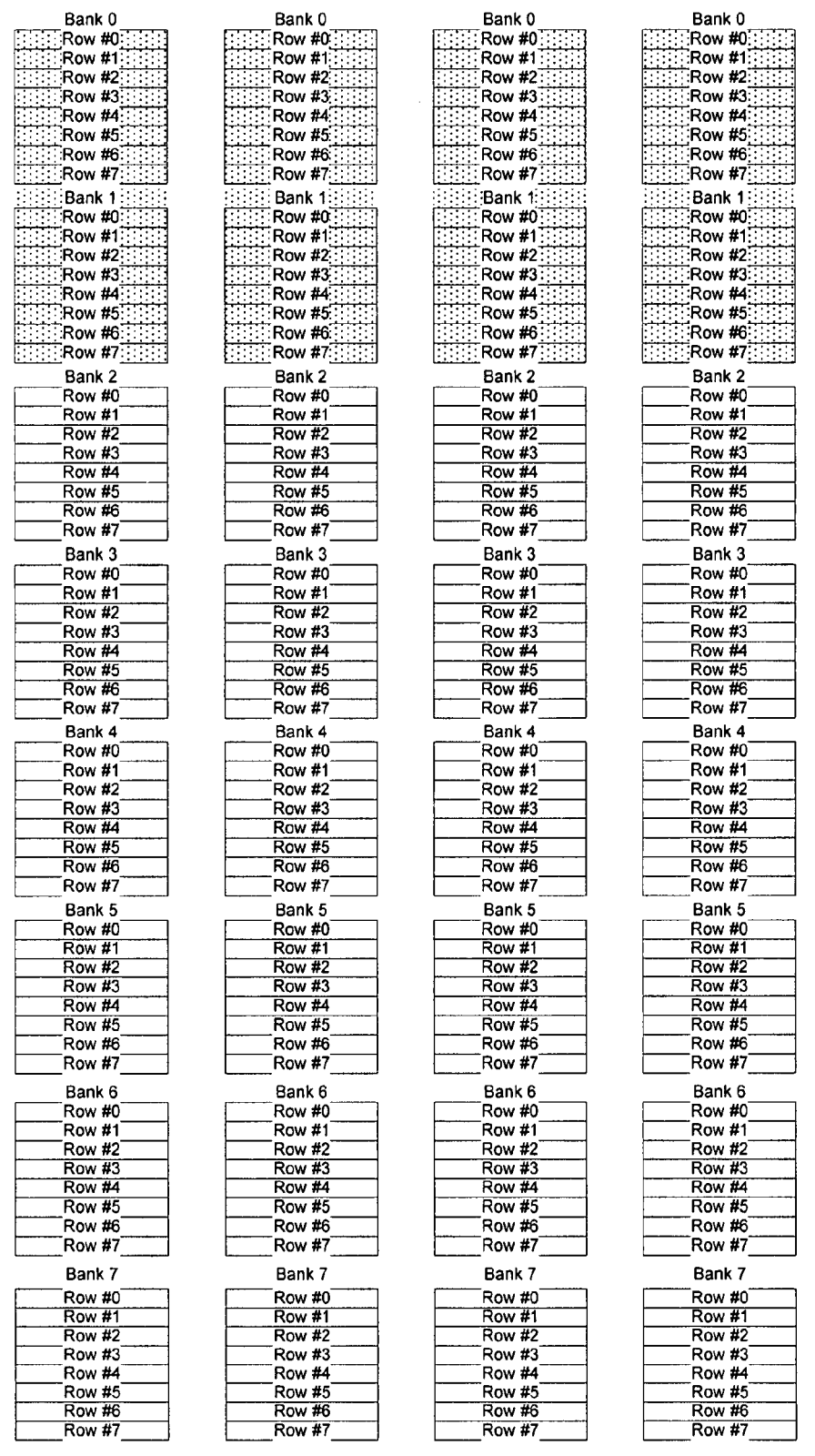

Thus, at operation 315 the memory controller relocates data in DRAM. For example, the memory controller may relocate contents of memory pages in the retained page map from a first location in a memory device to a second location to consolidate the memory pages identified in the retained page map in a subset of memory banks, ranks or DIMMs in the DRAM. For example, FIG. 5 is a schematic illustration of a DRAM before the pages are relocated by the memory controller, and FIG. 6 is a schematic illustration of the DRAM after the pages are relocated.

At operation 320, the memory controller generates a "page relocation table" which stores information indicating where in the physical DRAM each memory page was relocated. At the end of the process, the memory controller saves the page relocation table in a DRAM location which will be maintained in the sleep state (operation 325). Also, at end of this process the memory controller has freed up a number of DRAM banks and can initiate an sleep state entry during which some DRAM banks (i.e., banks which do not contain valid/useful data any more) are not placed in Self-Refresh state and are allowed to "leak" (operation 330), thereby reducing platform sleep state power consumption.

When the platform later exits sleep state and transitions back to S0 state, the DRAM controller needs to reverse what it did during a sleep state entry. Thus, at operation 410 the system monitors for a state change event. When a sleep state exit has been detected (operation 415), then control passes to operation 420 and the memory controller restores the DRAM configuration from the page relocation table. In some embodiments, the memory controller removes the DRAM from Self-Refresh state, reads from DRAM the page relocation table and uses it to restore the original location of each memory page. Once that has completed, the system is allowed to continue its sleep exit process normally (operation 425). Whenever the OS or some application attempt to access a page which was not retained in DRAM during sleep state, a page-fault occurs and the page is reloaded from the hard disk.

Thus, by implementing the logic described with reference to FIGS. 2-4 in an electronic apparatus as described with reference to FIG. 1, there is provided an electronic apparatus which comprises a processor, at least one non-volatile memory module, logic to generate a retained page map which indicates memory pages in at least one memory module to be retained in memory, logic to receive a signal to alter the operating state of the electronic device to a sleep state, logic to relocate contents of memory pages in the retained page map from a first location in a memory device to a second location to consolidate the memory pages identified in the retained page map in a subset of memory devices, logic to generate a page relocation table which indicates the first location and the second location of the contents of the memory pages, and logic to maintain the subset of memory devices in a self-refresh sleep state.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method to manage volatile memory in an electronic device, comprising:
   generating a retained page map which indicates memory pages in at least one memory module to be retained in memory;
   receiving a signal to alter the operating state of the electronic device to a sleep state;
   relocating contents of memory pages in the retained page map from a first location in a memory device to a second location to consolidate the memory pages identified in the retained page map in a subset of memory devices;
   generating a page relocation table which indicates the first location and the second location of the contents of the memory pages; and
   maintaining the subset of memory devices in a self-refresh sleep state.

2. The method of claim 1, wherein generating a retained page map which indicates memory pages in at least one memory module to be retained in memory comprises tracking memory pages which have been opened in read-write mode since being retrieved from a non-volatile memory location.

3. The method of claim 1, wherein generating a retained page map which indicates memory pages in at least one memory module to be retained in memory comprises tracking memory pages which have been updated since being retrieved from a non-volatile memory location.

4. The method of claim 1, further comprising storing the page relocation table in a memory module.

5. The method of claim 1, further comprising placing one or more memory devices outside the subset of memory devices into a sleep state in which the memory is not refreshed.

6. The method of claim 1, further comprising:
   receiving a signal to remove the device from a sleep state; and
   in response to the signal, restoring the contents of the volatile memory to a state that existed prior to receiving a signal to alter the operating state of the electronic device to a sleep state.

7. The method of claim 6, wherein restoring the contents of the volatile memory comprises relocating contents of memory pages in the retained page map from the second location back to the first location.

8. An electronic apparatus, comprising:
   a processor;
   at least one non-volatile memory module;
   logic to generate a retained page map which indicates memory pages in at least one memory module to be retained in memory;

logic to receive a signal to alter the operating state of the electronic device to a sleep state;

logic to relocate contents of memory pages in the retained page map from a first location in a memory device to a second location to consolidate the memory pages identified in the retained page map in a subset of memory devices;

logic to generate a page relocation table which indicates the first location and the second location of the contents of the memory pages; and logic to maintain the subset of memory devices in a self-refresh sleep state.

9. The electronic apparatus of claim 8, wherein further comprising logic to track memory pages which have been opened in read-write mode since being retrieved from a non-volatile memory location.

10. The electronic apparatus of claim 8, further comprising logic to track memory pages which have been updated since being retrieved from a non-volatile memory location.

11. The electronic apparatus of claim 8, further comprising further comprising logic to store the page relocation table in a memory module.

12. The electronic apparatus of claim 8, further comprising logic to place one or more memory devices outside the subset of memory devices into a sleep state in which the memory is not refreshed.

13. The electronic apparatus of claim 8, further comprising logic to:

receive a signal to remove the device from a sleep state; and in response to the signal, restoring the contents of the volatile memory to a state that existed prior to receiving a signal to alter the operating state of the electronic device to a sleep state.

14. The electronic apparatus of claim 13, further comprising logic to relocate contents of memory pages in the retained page map from the second location back to the first location.

* * * * *